(12) United States Patent
Pagani

(10) Patent No.: US 9,275,962 B2
(45) Date of Patent: Mar. 1, 2016

(54) PROBE PAD WITH INDENTATION

(75) Inventor: Alberto Pagani, Nova Milanese (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 790 days.

(21) Appl. No.: 13/106,557

(22) Filed: May 12, 2011

(65) Prior Publication Data

US 2011/0278568 A1    Nov. 17, 2011

(30) Foreign Application Priority Data

May 12, 2010    (IT) .............................. MI2010A0843

(51) Int. Cl.
*H01L 23/00* (2006.01)

(52) U.S. Cl.
CPC ................ *H01L 24/05* (2013.01); *H01L 24/92* (2013.01); *H01L 2224/04042* (2013.01); *H01L 2224/05082* (2013.01); *H01L 2224/05144* (2013.01); *H01L 2224/05155* (2013.01); *H01L 2224/05157* (2013.01); *H01L 2224/05164* (2013.01); *H01L 2224/05173* (2013.01); *H01L 2224/05644* (2013.01); *H01L 2224/05664* (2013.01); *H01L 2224/48463* (2013.01); *H01L 2924/014* (2013.01); *H01L 2924/01013* (2013.01); *H01L 2924/01027* (2013.01); *H01L 2924/01029* (2013.01); *H01L 2924/01033* (2013.01); *H01L 2924/01045* (2013.01); *H01L 2924/01046* (2013.01); *H01L 2924/01079* (2013.01); *H01L 2924/1461* (2013.01); *H01L 2924/19041* (2013.01)

(58) Field of Classification Search
CPC ......... H01L 24/04; H01L 24/05; H01L 24/92; H01L 2224/04042

USPC ............................................... 257/48, E21.59
See application file for complete search history.

(56) References Cited

U.S. PATENT DOCUMENTS

| 5,391,516 A * | 2/1995 | Wojnarowski | H01L 24/05 257/E21.585 |
| 6,274,935 B2 * | 8/2001 | Uzoh | 257/748 |

(Continued)

FOREIGN PATENT DOCUMENTS

| JP | 2007214363 | 8/2007 |
| JP | 2008235314 | 10/2008 |

OTHER PUBLICATIONS

Search Report for Italian Application No. MI2010A000843, Ministero dello Sviluppo Economico, Munich, Dec. 28, 2010, pp. 2.

(Continued)

*Primary Examiner* — John P Dulka
(74) *Attorney, Agent, or Firm* — Gardere Wynne Sewell LLP

(57) ABSTRACT

An integrated electronic circuit having probe indentations filled by a hard covering substance. The integrated circuit device results from a process of manufacture including forming a substrate comprising a plurality of functional components of the electronic circuit, creating a plurality of conductive layers on such substrate to form an electric contact region with high hardness equal to or greater than a first hardness value of about 300 HV, contacting the electric contact region with a probe thereby causing an indentation. In an embodiment, the process further comprises, after the test run, creating a covering conductive layer on at least one part of the electric contact region contacted by the probe to fill the indentation.

22 Claims, 2 Drawing Sheets

(56) References Cited

U.S. PATENT DOCUMENTS

| | | | | |
|---|---|---|---|---|
| 6,339,257 | B1* | 1/2002 | Fujiki | H01L 24/05 257/751 |
| 6,734,036 | B2* | 5/2004 | Chakrabarti | H01L 31/022408 257/458 |
| 6,747,355 | B2* | 6/2004 | Abiru | H01L 23/5226 257/758 |
| 7,105,379 | B2* | 9/2006 | Tsao | H01L 24/05 257/48 |
| 7,470,612 | B2* | 12/2008 | Choi | H01L 21/76843 257/E21.579 |
| 7,550,844 | B2* | 6/2009 | Matsuki | H01L 23/3128 257/737 |
| 8,324,622 | B2* | 12/2012 | Zhang | H01L 24/05 257/48 |
| 2001/0000416 | A1 | 4/2001 | Uzoh | H01L 23/53238 257/781 |
| 2001/0046715 | A1* | 11/2001 | Takemoto | G01R 1/06711 438/2 |
| 2003/0107137 | A1* | 6/2003 | Stierman et al. | 257/763 |
| 2005/0073057 | A1* | 4/2005 | Tiziani et al. | 257/784 |
| 2005/0208684 | A1* | 9/2005 | Yamada | H01L 22/20 438/14 |
| 2007/0228561 | A1* | 10/2007 | Matsuki et al. | 257/737 |
| 2008/0037667 | A1* | 2/2008 | Visalli et al. | 375/260 |
| 2008/0083923 | A1* | 4/2008 | Nakauchi | H01L 22/32 257/48 |
| 2008/0143454 | A1* | 6/2008 | McCorquodale et al. | 331/179 |
| 2008/0237854 | A1* | 10/2008 | Wu | H01L 24/10 257/738 |
| 2009/0243038 | A1* | 10/2009 | Nagai et al. | 257/532 |
| 2011/0089962 | A1* | 4/2011 | Pagani | G01R 1/07 324/754.03 |

OTHER PUBLICATIONS

Ilze Manika; Janis Maniks, "Effect of substrate hardness and film structure on indentation depth criteria for film hardness testing; Effect of substrate hardness and film structure on indentation depth criteria", Journal of Physics D: Applied Physics, 20080407 Institute of Physics Publishing Ltd, GB—ISSN 0022-3727, vol. 41, Nr:7, pp. 74010.

E-384-06 Standard test Method for Microindentation Hardness of Materials, ASTM International Standard, 20070101 ASTM International, US, vol. 384, pp. 487-518, XP009142601.

Sauter, Wolfgang et al: "Problems with Wirebonding on Probe Marks and Possible Solutions," 2003 Electronic Components and Technology Conference, 2003 IEEE, pp. 1350-1358.

* cited by examiner

PROBE PAD WITH INDENTATION

PRIORITY CLAIM

The instant application claims priority to Italian Patent Application No. MI2010A000843, filed May 12, 2010, which application is incorporated herein by reference in its entirety.

TECHNICAL FIELD

An embodiment generally relates to the electronic field. More specifically, an embodiment relates to the test of integrated electronic circuits.

BACKGROUND

Electronic circuits are generally tested to verify their proper operation; this is often of the utmost importance to ensure a high quality of the production process of the electronic circuits. Tests may be performed on each electronic circuit at different levels of the corresponding production process: for example, a test process called EWS (Electrical Wafer Sort) is performed on the electronic circuits included in a corresponding wafer of semiconductor material, before the individual portions of the wafer on which there are integrated the electronic circuits are diced into individual chips and embedded in respective packages. Such test includes measurements performed on each electronic circuit by automatic test equipment, known as ATE. Such test apparatus is provided with a probe card, which substantially includes a printed circuit board comprising a plurality (typically, hundreds, or even thousands) of probes of conductive material for contacting corresponding conductive pads of the electronic circuits to be tested. During the test, the probe card is positioned in correspondence of a group of electronic circuits of the wafer so that the probes mechanically contact their pads (operation that in jargon is defined as probing); this provides an electrical connection between the test apparatus and the pads of such electronic circuits, which allows the test thereof. The same operations are repeated in succession on each group of electronic circuits of the wafer until all the electronic circuits formed therein have been tested.

In order to ensure that a proper probing procedure has been performed between each probe and the corresponding pad, typically before or after the test, a (manual or automatic) checking operation is carried out which consists of detecting and analyzing a probe mark left by the probe on the pad during the probing operation.

Being able to detect the presence and the arrangement of the probe marks allows first determining the correct alignment and centering between the probes of the probe card on the pads of the electronic circuits under test; in this way, it is possible to reconfigure the parameters of the probing so as to reduce the risk of damage of a passivation layer around the pad caused by a not totally accurate probing. Moreover, such risk is, in modern applications, very considerable, since the number of pads within a same electronic circuit is higher and higher, while their sizes and their relative separation distances are smaller and smaller.

Moreover, the analysis of the probe mark allows determining a correct and uniform pressure exerted by the probes of the probe card on the pads of the electronic circuits, so as to be able to act on the parameters of the probing in order to have a low and uniform contact resistance during the test.

However, in recent applications, the test EWS has drawbacks connected to the impracticality to impossibility of being able to perform such checking operation.

In fact, because of growing demands, especially in automotive applications, of electronic circuits capable of operating in adverse conditions (e.g., high temperatures), the pads (and the corresponding electric connections between the pads and respective terminals of the package) of such electronic circuits are more and more frequently formed by different materials with respect to those traditionally used (such as copper and aluminium). For example, US patent application No. US 2005/0073057, which is incorporated by reference, proposes a multi-layer pad structure having a high hardness property; such property is achieved by using a conductive material with high hardness (e.g., nickel or alloys thereof), possibly covered by a thin protective layer of conductive material that is relatively soft (e.g., palladium or alloys thereof).

The greater hardness of such pads with respect to the materials traditionally used for making the probes results, during the probing, in that the pad is not scratched by the respective probe; in this way, the probe mark is difficult to detect to undetectable, so that it turns out to be very difficult, if not practically impossible, to perform the checking operation of the probing. This involves a difficulty to substantial impossibility to act on parameters of the probing, with consequent increase during the test of the cases of breakage of the passivation layer, and loss of electric yield (due to a high and heterogeneous contact resistance between each probe of the probe card and the corresponding pad), which imply possible false test failures, and correspondingly a reduction in the process yield with consequent increase of the production costs of the electronic circuits.

At the same time, the difficulty/impossibility of leaving the probe mark may be due in part to the mechanical properties of the specific type of probe used for testing. In this regard, various types of probes are commercially available, such as cantilever, MEMS and vertical probes, but their use does not provide satisfactory results in certain situations, making them in practice not always effectively usable.

Typically during the probing it may happen that such probes cause an excessively deep probe mark on the pad such to uncover some layers thereof that, once exposed to the external environment, may be subject to chemical and/or physical changes. This happens for example in the case of nickel, which oxidizes if the palladium protective conductive layer formed thereon is removed, and of copper, which oxidizes if the aluminium protective conductive layer formed thereon is removed. For example, in the case of nickel, it may be experienced the removal of palladium after the use of probes that have a high hardness or after repeated probing actions of the probe on the pad.

In addition, an excessively deep probe mark on the pad typically causes a loss of yield during the assembly operations that connect, for example by welding of wire bonding, the pad of the electronic circuit and the terminals of the corresponding package, as in such situation the welding is not effective; in particular, the effectiveness of the welding is compromised both for geometrical reasons (a highly non-planar surface, such as that obtained in response to an excessively deep probe mark, may not allow a good adhesion), and for reasons of lack of compatibility of the materials involved in the welding (e.g., nickel generally has poor adhesion properties with different materials).

SUMMARY

In view of the state of the art herein shown, an embodiment overcomes the above-mentioned drawbacks.

More specifically, an embodiment is a manufacturing process for an integrated electronic circuit; the process comprises forming a substrate comprising a plurality of functional components of the electronic circuit, creating a plurality of conductive layers on such substrate to form an electric contact region with high hardness equal to or greater than a first hardness value of about 300 HV, contacting the electric contact region with a probe and running an electric test of the electronic circuit. In an embodiment, the process further comprises, after the test run, creating a covering conductive layer on at least one part of the electric contact region contacted by the probe.

Another embodiment relates to a corresponding electronic circuit.

Thanks to an embodiment, even in particular applications, such as the automotive applications, for which it may be necessary to produce electronic circuits having materials that make the pads very hard, it may be possible to produce electronic circuits with high electrical, physical and mechanical properties despite performing the testing thereof through probes having high hardness. In this way, it may be possible to detect and analyze the probe mark indicating the occurred contact between the probe and the pad during the running of the test, which allows using the same techniques of checking and analysis of the probe mark that typically are used downstream the test of standards electronic circuits (i.e., having traditional pads) performed through traditional probes. Therefore, an embodiment implies a considerable reduction of the production costs, since the yield losses resulting from damages of the circuits or unreliable test results may be reduced at the minimum, which are caused, in turn, by the difficulty/impossibility of controlling the probe mark in order to act accordingly on the parameters of the probing process.

BRIEF DESCRIPTION OF THE DRAWINGS

Features and advantages of an embodiment will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is expressly understood that the figures are not necessarily drawn to scale and that, unless otherwise indicated, they are simply used to conceptually illustrate the described structures and procedures. In particular.

DETAILED DESCRIPTION

Figure 1A:
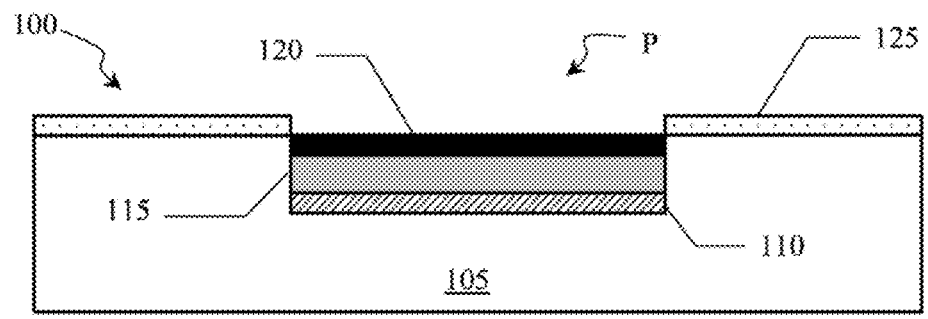
FIGS. 1A-1C show some phases of a manufacturing or production process of an electronic circuit according to an embodiment.
Figure 1B:
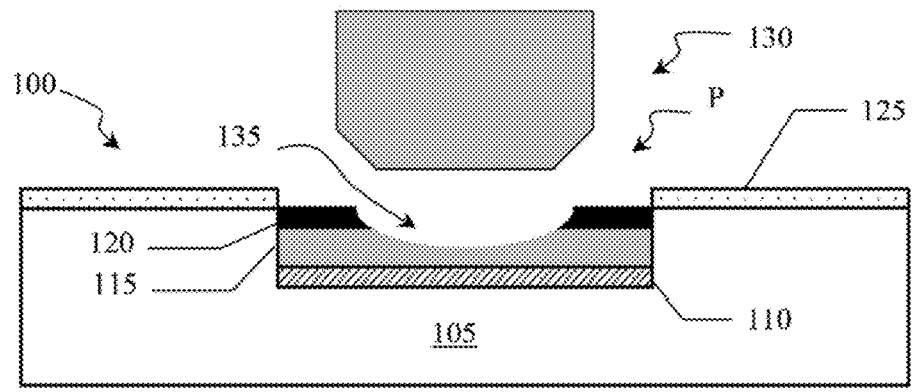
Figure 1C:
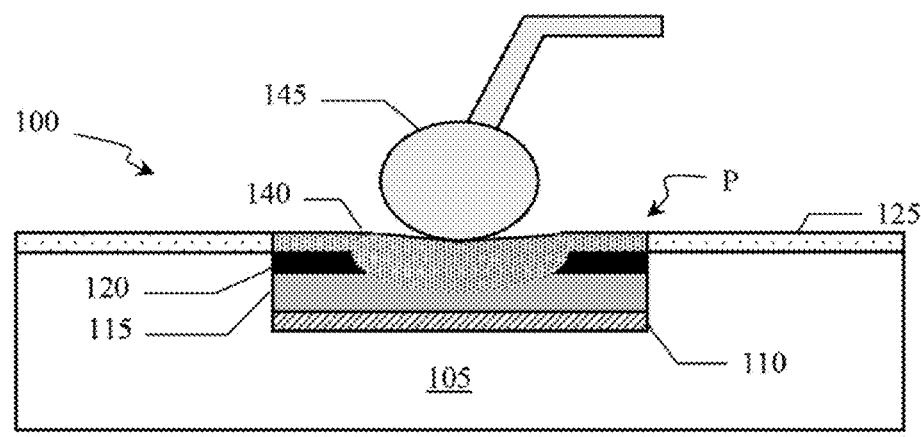

With reference to FIGS. 1A-1C, they show, according to an embodiment, some salient phases of a production process of electronic circuits, such phases including the functional and/or parametric electric test (or simply electric test, or test). In general, the production process is performed at the level of a wafer of semiconductor material in which identical electronic circuits are made concurrently in large number and separated at the end through a cutting operation; for the sake of description simplicity, however, in the following reference will be made to only one of such electronic circuits, indicated by the number reference 100.

In particular, in FIG. 1A there is shown a part of the electronic circuit 100 at a final phase of its production process, before the electrical test and the assembly operation for encapsulating the electronic circuit 100 within the corresponding package. The electronic circuit 100 includes a substrate 105 in which there are formed, through, for example, any known process, functional components implementing specific functions of the electronic circuit 100. Such functional components, which may include active components (such as transistors) and/or passive components (such as resistors, capacitors, and inductors) are typically formed such as to occupy different functional parts of the volume of the electronic circuit, with each functional part that is electrically coupled to the other functional parts coupled through corresponding metal conductive layers, for example of copper or aluminium, and layers of conductive vias that are placed on or included between such functional parts.

A portion of a last metal layer defines a conductive contact 110, above which a conductive layer 115 and a thin surface conductive layer 120 may be created through known techniques (e.g., electrodeless or electrolytic or deposition processes).

The conductive layer 115 is formed, in the exemplary described embodiment, of a material having high hardness, for example nickel, which is used for coating, by protecting, the conductive contact 110 and thus the functional substrate 105 of the electronic circuit 100. For example, the thickness of the conductive layer 115 may typically have a value of some μm (from approximately 1 up to approximately 20 μm) in order to ensure adequate protection of the conductive contact 110 (and of the functional components below) and preserve it from malfunctions in case that the electronic circuit 100 is used in environments with high temperature (such as in automotive applications).

The surface conductive layer 120 is instead made of a conductive material suitable to effectively coat the conductive layer 115, so as not to expose it to direct contact with the surrounding environment; in this way, it may be possible to prevent oxidation phenomena (or, in general, chemical and/or physical changes) of the conductive layer 115 if the latter has properties that cause its oxidation in contact with the air, as it may happen in the case herein considered of conductive layer 115 made of nickel.

In the exemplary described embodiment, the conductive layer 120 is of palladium, which has a lower hardness than that of nickel, and may have a thickness of approximately between 2% and 75%, for example, approximately between 2% and 15%, such as approximately 10% of the thickness of the conductive layer 115 of nickel below it.

The structure thereby obtained, formed by the conductive contact 110 and by the conductive layers 115 and 120 on it, defines a pad P that is to be contacted for testing the electronic circuit 100 and for electrically coupling, in the following assembly phase, the electronic circuit 100 to the terminals of the respective package.

In the particular described scenario, the obtained pad P has a hardness totally greater than that of a traditional pad. For example, a traditional pad is typically formed by a conductive copper layer (usually by a portion of the last metal layer of the electronic circuit 100) and by a conductive aluminium layer placed on it (or their alloys), and such materials may have hardness values between approximately 10 HV and 150 HV (according to the Vickers scale) depending on the relative thickness of the conductive layers forming the pad. In the described pad P, instead, the conductive layer 115 in nickel, created for example by using an electrodeless process, may have hardness values between approximately 350 HV and 750 HV (and up to approximately 1100 HV after specific thermal treatments); please note that, although palladium, from which the conductive layer 120 is formed, has, as known, a lower hardness than that of nickel, the smaller thickness of the conductive layer 120 with respect to the below conductive layer 115 results in that the total hardness value of the pad P is given with a good approximation by the hardness value of the conductive layer 115.

Exposed portions of the functional substrate 105 of the electronic circuit 100 are coated with a passivation layer 125 for protecting them from contamination/corrosion by weathering or unwanted chemical reactions at their interface.

As schematized in FIG. 1B, in order to perform the probing of the pad P of the electronic circuit 100, a conductive probe 130 is used in which at least an end portion thereof has on the whole a high hardness (e.g., with hardness values, in first approximation, approximately between 300 and 1500 HV or even higher); the conductive probe 130, only the end portion of which that is intended to contact the pad P is schematically shown in such figure, may be for example a cantilever, MEMS, or vertical probe.

In FIG. 1B there is shown the effect of the action of the probe 130 on the pad P: the resulting probe mark, indicated by the reference 135, is represented schematically by a hollow extending from the outer surface of the pad P (i.e., from the thin conductive layer 120) to part of the conductive layer 115 below.

As shown in FIG. 1C, once the electric test of the electronic circuit 100 is performed, a coating conductive layer 140 is placed on the surface conductive layer 120 and on the probe mark 135. Such coating layer 140, which may be for example of palladium, gold or alloys thereof with the possible addition of other materials, substantially plays a dual function: firstly, it prevents oxidation phenomena of the portion of the nickel conductive layer 115 that, because of the incision depth of the probe mark, turns out to be exposed to the action of atmospheric agents. Furthermore, it facilitates a welding process between the pad P and conductive means on it; in fact, having the probe 130 a high hardness, the depth of the probe mark 135 may be relevant, and therefore determine a non-planar shape of the hollow intended to the welding operation of the conductive means. This might result in a loss of electric continuity between the pad P and the conductive means; the presence of the coating conductive layer 140, instead, reduces, or even cancels, the depth of the probe mark 135, thus possibly ensuring a greater grip of the conductive means welded thereon. Such connection is shown exemplarily, but not limitatively, in the case that such contact includes a wirebond 145, made above the coating layer 140; such wire bond 145 is used for electrically contacting the pad P (and thus the electronic circuit 100) to the terminals of the package in which the electronic circuit 100 is encapsulated in the subsequent assembly process (not shown in any figure).

Figure 2A:
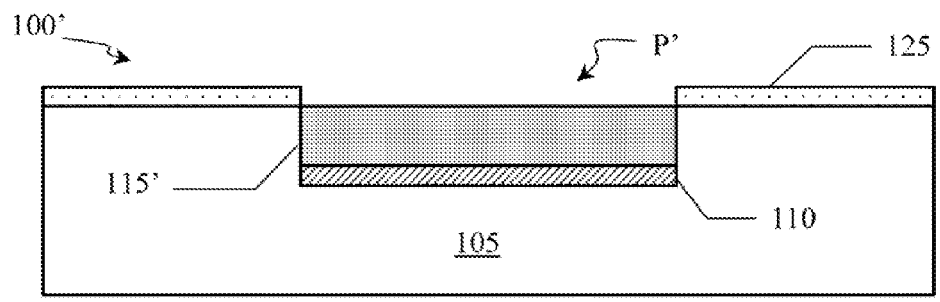
FIGS. 2A-2C show some phases of a production process of an electronic circuit according to another embodiment invention.
Figure 2B:
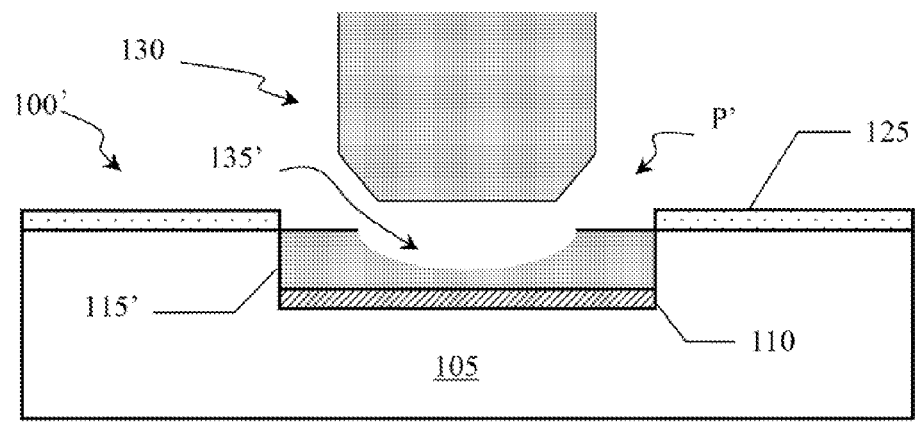
Figure 2C:
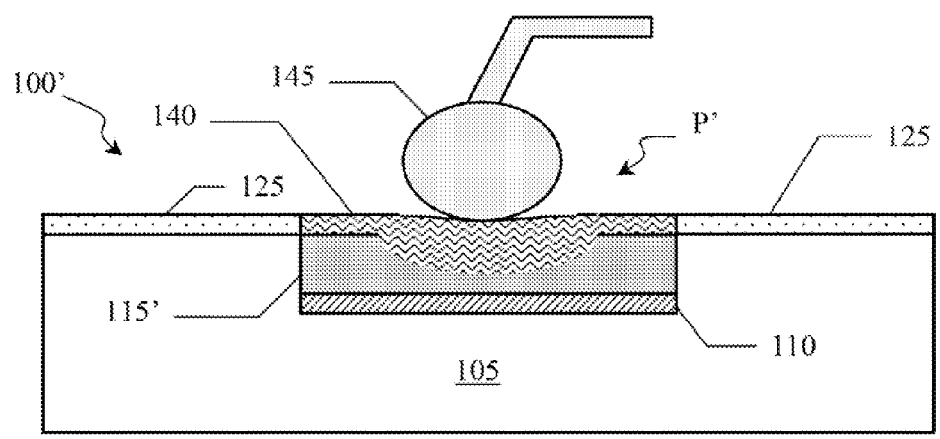

FIGS. 2A-2C show a production process of an electronic circuit 100' according to another embodiment. As shown in FIG. 2A, the electronic circuit 100' is substantially structurally identical to the electronic circuit 100, with a difference that the thin conductive layer 120 is no longer provided. In fact, the electronic circuit 100' includes a conductive layer 115' having both a high hardness and such properties that it typically cannot be oxidized and/or altered by the aggression of atmospheric agents (at least during the whole period of the production process). For example, such conductive layer 115' may be of rhodium, cobalt and/or alloys thereof with the addition of other materials (such as palladium in proper quantities). The conductive layers 110 and 115' form the corresponding pad P' of the electronic circuit 100'.

Analogously to that previously described, in FIG. 2B the probing of the probe 130 on the pad P' is carried out for performing the electric test of the electronic circuit 100', after which the probe 130 is removed from the pad P' and a probe mark 135' (extending within a portion of the conductive layer 115') is then visible.

As schematized in FIG. 2C, then a coating layer 140 is placed on the conductive layer 115' and on the probe mark 135', by using known techniques; in this way, the subsequent welding process of the wirebond 145 may be improved, as described above.

The described embodiments allow using, even in electronic circuits having pads P, P' having high hardness, the same techniques of detection and analysis of the probe mark normally used for electronic circuits with traditional pads, substantially without that the properties of the electronic circuits are altered (thanks to the use of the coating layer 140 that allows not exposing the pad P, P' to the external environment); in this way, it may be possible to optimally adjust the probing operation of the probe 130 on the pad P, P' so as to avoid waste, defects and/or breakage during the production of the electronic circuits. Moreover, an embodiment allows preventing the electric unreliability of the bonding operation of the electronic circuit 100 that might naturally occur due to the use of materials with high hardness (hard to solder) and the presence of the probe mark on such materials (that deform the surface on which the wirebond is welded).

Naturally, in order to satisfy local and specific requirements, a person skilled in the art may apply to an embodiment described above many logical and/or physical modifications and alterations. More specifically, although particular embodiments have been described with a certain degree of particularity, it should be understood that various omissions, substitutions and changes in the form and details as well as other embodiments are possible. In particular, different embodiments may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

In particular, the above-described embodiments are merely illustrative and in no way limitative. For example, an embodiment may be implemented with equivalent processes (by using similar steps, removing some steps being not essential, or adding further optional steps); moreover, the steps may be performed in different order, concurrently or in an interleaved way (at least partly). For example, the production process of the electronic circuit 100 may provide an additional phase including washing (through the use of high pressure water or by using plasma cleaning techniques) of the exposed surface of the conductive layer 115 before creating the conductive layer 140. The same step may be performed for the electronic circuit 100' before welding the wirebond 145 on the conductive layer 140.

The pad of the electronic circuit may include several and different layers of conductive material, depending on specific design demands or according to economic considerations. Moreover, each conductive layer of the pad may be formed in turn by a plurality of conductive layers. Furthermore, on the pad or on some intermediate conductive layers, a gold coating may be provided for improving electric properties thereof. In general, the conductive layers may be made, for example, of materials all equal to each other, depending on the desired hardness requirements: conductive materials that may be used in appropriate combination include (but not exclusively) palladium, nickel, gold, copper and aluminium.

Similar considerations are valid if the wire bond is replaced by a contact protruding protuberance (in jargon, bump) or by other types of electrical connections not explicitly mentioned but structurally and/or functionally equivalent.

Furthermore, an embodiment of the integrated circuit 100 or 100' may be coupled to one or more other integrated circuits or components to form a system, such as a computer system, cell phone, smart phone, system on a chip (multiple integrated circuits on a same die), or other electronic system. For example, the integrated circuit 100 or 100', or another integrated circuit of such a system, may be a processor or controller.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An integrated circuit, comprising:
   a substrate; and
   a conductive pad disposed over the substrate and including:
      a first conductive layer having an indentation, and
      a second conductive layer disposed over the first conductive layer and having an opening that is aligned with the indentation, and
      a third conductive layer disposed over the first and second conductive layers filling the indentation in the first conductive layer and the opening in the second conductive layer, the third conductive layer being at least coplanar with a top surface of the second conductive layer.

2. The integrated circuit of claim 1 wherein the first conductive layer consisting essentially of nickel.

3. The integrated circuit of claim 1 wherein the first conductive layer is harder than the second conductive layer.

4. The integrated circuit of claim 1 wherein the first conductive layer has a hardness within a range of 350 and 1100 HV.

5. The integrated circuit of claim 1 wherein the first conductive layer has a thickness within a range of 2 to 20 μm.

6. The integrated circuit of claim 1 wherein the indentation comprises a probe mark.

7. The integrated circuit of claim 1 wherein the second conductive layer comprises palladium.

8. The integrated circuit of claim 1 wherein the second conductive layer comprises gold.

9. The integrated circuit of claim 1 wherein the second conductive layer is disposed over a portion of the first conductive layer beyond the indentation.

10. The integrated circuit of claim 1, wherein the third conductive layer is disposed over a portion of the first conductive layer beyond the indentation and over a portion of the second conductive layer beyond the opening.

11. The integrated circuit of claim 1, wherein the second conductive layer has a thickness that is between 2% and 15% of the thickness of the first conductive layer.

12. The integrated circuit of claim 1, further comprising:
   a passivation layer disposed over the substrate adjacent to the conductive pad and having a top surface; and
   wherein the third conductive layer has a top surface that is coplanar with the top surface of the passivation layer.

13. The integrated circuit of claim 1, further comprising a wire bond disposed over the indentation.

14. The integrated circuit of claim 1, further comprising a wire bond in contact with the third conductive layer.

15. The integrated circuit of claim 1, further comprising a circuit disposed in the substrate and coupled to the conductive pad.

16. The integrated circuit of claim 1, further comprising a package within which the substrate and the conductive pad are disposed.

17. An integrated circuit, comprising:
   a substrate; and
   a conductive pad disposed over the substrate and including:
      a first conductive layer having an indentation,
      a second conductive layer disposed covering the first conductive layer, and
      a cavity extending through the second conductive layer and aligned with the indentation in the first conductive layer, and
      a third conductive layer that fills the cavity and covers the first and second conductive layers to form a substantially planar surface above the second conductive layer for receiving a wire bond.

18. The integrated circuit of claim 17, wherein the second conductive layer has a thickness that is between 2% and 15% of a thickness of the first conductive layer.

19. The integrated circuit of claim 17, further comprising:
   a passivation layer disposed over the substrate adjacent to the conductive pad and having a top surface; and
   wherein the third conductive layer has a top surface that is coplanar with the top surface of the passivation layer.

20. The integrated circuit of claim 17 wherein the first conductive layer consists essentially of nickel.

21. The integrated circuit of claim 17 wherein the first conductive layer is harder than the second conductive layer.

22. The integrated circuit of claim 17 wherein the first conductive layer has a hardness within a range of 350 and 1100 HV.

* * * * *